United States Patent [19]

von Ammon et al.

[11] Patent Number: 5,487,354

[45] Date of Patent: Jan. 30, 1996

[54] METHOD FOR PULLING A SILICON SINGLE CRYSTAL

[75] Inventors: Wilfried von Ammon; Erich Dornberger, both of Burghausen; Hans Oelkrug, Haiming; Peter Gerlach, Burghausen; Franz Segieth, Kirchham, all of Germany

[73] Assignee: Wacker-Chemitronic Gesellschaft fuer Eletronik-Grundstoffe mbH, Burghausen, Germany

[21] Appl. No.: 349,397

[22] Filed: Dec. 5, 1994

[30] Foreign Application Priority Data

Dec. 16, 1993 [DE] Germany ............ 43 43 051.1
Apr. 28, 1994 [DE] Germany ............ 44 14 947.6

[51] Int. Cl.⁶ .................................................... C30B 15/10
[52] U.S. Cl. ........................ 117/13; 117/17; 117/213
[58] Field of Search .......................... 117/13, 17, 27, 117/31, 34, 213, 217, 222; 348/86

[56] References Cited

U.S. PATENT DOCUMENTS

| 4,330,362 | 5/1982 | Zulehner | 117/33 |
| 4,783,235 | 11/1988 | Morioka et al. | 117/13 |
| 4,981,549 | 1/1991 | Yamashita et al. | 117/3 |
| 5,078,830 | 1/1992 | Shirata et al. | 117/31 |

FOREIGN PATENT DOCUMENTS

| 0503816 | 9/1992 | European Pat. Off. . |
| 0504837 | 9/1992 | European Pat. Off. . |
| 2821481 | 11/1979 | Germany . |
| 3905626 | 8/1989 | Germany . |

OTHER PUBLICATIONS

M. Hourai et al., Proceedings of Progress in Semiconductor Fabrication, Technical Conference at Semicon Europe 1993.
M. Hasebe et al., Defect Control in Semiconductors, Belgium Elsevier Science Publishers B.V., p. 157 (1990) "Ring–Likely Distributed Stacking Faults in Cz–Si Wafers".

*Primary Examiner*—R. Bruce Breneman
*Assistant Examiner*—Felisa Garrett
*Attorney, Agent, or Firm*—Collard & Roe

[57] ABSTRACT

A method for pulling a silicon single crystal has the single crystal being pulled at a speed defined as maximum pulling speed in the vertical direction with respect to a silicon melt held in a crucible. The value of the maximum pulling speed is approximately proportional to the axial temperature gradient in the growing single crystal.

6 Claims, No Drawings

METHOD FOR PULLING A SILICON SINGLE CRYSTAL

BACKGROUND OF THE INVENTION

1. Field of the Invention

The invention relates to a method for pulling a silicon single crystal, in which the single crystal is pulled at a certain speed in the vertical direction with respect to a silicon melt held in a crucible.

2. The Prior Art

This method named after its inventor Czochralski provides single crystals which are doped with a high content of oxygen originating from the quartz crucibles normally used. The high oxygen doping results in the formation of oxidation-induced stacking faults (OSF) in the single crystal. It has already been established that the spatial distribution with which OSFs occur in silicon wafers cut from single crystals is dependent substantially on the pulling speed during the pulling of the single crystal. According to a report in "Defect Control in Semiconductors" (M. Hasebe et al., Elsevier Science Publishers B. V., page 157 (1990)), OSFs occur in high density inside an annular region of silicon wafers if the single crystal was pulled at a pulling speed of 0.5 to 1.0 mm/min. The annular region, hereinafter referred to as the stacking-fault ring, is undesirable since OSFs are as a rule extremely troublesome in that region of the silicon wafer into which electronic components are to be integrated.

The stacking-fault ring is situated concentrically with respect to the circumference of the silicon wafer. Its radius is smaller or larger as a function of the speed with which the single crystal was pulled. If the pulling speed was just above the lower limit specified of 0.5 mm/min, the stacking-fault ring is situated closely around the wafer center. If the single crystal was pulled at a speed just below the upper limit specified of 1.0 mm/min, the stacking-fault ring is already situated close to the circumference line of the silicon wafer.

European Patent Application EP-503 816 A1 discloses that additional crystal defects occur inside the stacking-fault ring all the more often, the higher the speed was in pulling the single crystal. A high density of said crystal defects impairs, in particular, the breakdown strength of dielectric oxide films, which are created on a side face of the silicon wafer in order to produce large-scale integrated circuits.

It can be demonstrated (M. Hourai et al., Proceedings of Progress in Semiconductor Fabrication, Technical Conference at Semicon Europe 1993, Semicon Europe, Belgium (1993)) that the breakdown strength of oxide films, frequently referred to as gate oxide integrity (GOI), varies significantly in silicon wafers with a stacking-fault ring, depending on whether it is measured in a region inside or outside the stacking-fault ring. Thus, the GOI in a region outside the stacking-fault ring meets the high requirements which are imposed on the breakdown strength of a dielectric oxide film in the production of components. On the other hand, the GOI inside the stacking-fault ring is completely inadequate. In accord with the teaching of EP-503 816 A1, the GOI in silicon wafers of single crystals which have been pulled so rapidly that a stacking-fault ring can no longer be observed is inadequate in the entire region of the silicon wafer suitable for the integration of components.

To improve the GOI of silicon wafers originating from a single crystal which has been pulled at an economical speed of over 0.8 mm/min, the above-mentioned European patent specification proposes subjecting the silicon wafers to a temperature treatment in the range 1150° C. to 1280° C. For the same purpose, a certain thermal treatment of the single crystal during the pulling operation is recommended in European Patent Application EP-504 837 A2. Accordingly, the pulling conditions are to be adjusted and maintained so that at least a part of the growing single crystal whose temperature is above 1150° C. is situated at a distance of more than 280 mm above the melt surface.

Both proposals pursue the aim of improving the GOI quality. The occurrence of the stacking-fault ring at high pulling speeds is not obviated by the prior art.

SUMMARY OF THE INVENTION

It is an object of the present invention to improve the method for pulling silicon single crystals by the Czochralski method in such a way that the lower limit of the pulling speed $v_{crit}$ at which, if exceeded, the stacking-fault ring starts to appear can be raised.

The object is achieved by a method for pulling a silicon single crystal, in which the single crystal is pulled at a certain speed in the vertical direction with respect to a silicon melt held in a crucible, which method comprises pulling the single crystal at a speed which is defined as maximum pulling speed and whose value is approximately proportional to the axial temperature gradient in the growing single crystal.

If the pulling system does not have any structural features which increase the axial temperature gradient in the growing single crystal, according to the investigations of the inventors, silicon single crystals which provide wafers having very good GOI quality and have no stacking-fault ring can be pulled only at a low maximum pulling speed $v_{crit}$. On the other hand, the maximum pulling speed $v_{crit}$, and consequently, the cost-effectiveness of the pulling method can be increased beyond the hitherto known extent if such structural features are present.

So that a pulling system can be run at high maximum pulling speeds $v_{crit}$, it is important, in particular, that the axial temperature gradient, in particular in the region of the solid/liquid phase boundary of the growing single crystal, is as high as possible. The pulling system is consequently to be provided with structural features with whose aid the heat produced during the crystallization of the silicon can be effectively removed from the crystallization front. In addition, such a structural feature must prevent the cooling of the growing single crystal being impeded by heat radiation originating from the side walls of the crucible or from the melt surface. Examples of structural features with this effect are already known from the prior art. These are parts of the apparatus which are disposed around the growing single crystal as a thermally screening shield.

German Patent DE-28 21 481 describes a pot-shaped cover which reflects thermal radiation and with which the melt, the crucible and the space at the side of the crucible are covered during the crystal pulling so that gases emerging from the melt can be effectively prevented from flowing back onto the melt. Since this cover increases the axial temperature gradient in the growing single crystal, according to the present invention, a silicon single crystal can be pulled in a pulling system having said cover at a higher maximum pulling speed $v_{crit}$ than is possible in a pulling system in which the growing single crystal is screened neither from the melt surface nor from the side walls of the crucible.

If the shield which thermally screens the single crystal is actively cooled, the axial temperature gradient in the growing single crystal is increased further. Accordingly, the maximum pulling speed $v_{crit}$ can also be raised further. For this purpose, the pulling system could be provided, for example, with a thermal shield which is manufactured according to the prototype of the cooling dish disclosed in German *Offenlegungsschrift* DE-A 39 05 626 for controlling the dwell time of the growing single crystal in a certain temperature range.

If a thermally screening shield which surrounds the single crystal is used, it is advantageous if the lower edge of the shield approaches the solid/liquid phase boundary of the growing single crystal as closely as possible without touching it. If a lower edge/phase boundary spacing of 1 to 200 mm, preferably 20 to 200 mm, is not exceeded, the increase in the temperature gradient in the region of the solid/liquid phase boundary is particularly effective.

According to the invention, for a given configuration of the pulling system, a silicon single crystal is pulled at a speed which depends on the axial temperature gradient of the growing single crystal. Preferably, the axial temperature gradient in the region of the solid/liquid phase boundary is determined experimentally or calculated approximately. The maximum pulling speed $v_{crit}$ can be calculated according to the empirical formula:

$$v_{crit} = f * G.$$

The value $13*10^{-4}$ cm$^2$/K*min is to be substituted for the proportionality factor f. In order to obtain the maximum pulling speed $v_{crit}$ in the unit [cm/min], the axial temperature gradient G must be specified in the unit [K/cm].

The formula shows that the maximum pulling speed is approximately proportional to the axial temperature gradient in the growing single crystal. The maximum pulling speeds to be set according to the above-mentioned formula are up to 100% above the pulling speeds which were hitherto specified. Silicon wafers originating from single crystals which have been pulled at a maximum pulling speed determined according to the invention do not have a stacking-fault ring and have an excellent GOI: the dielectric breakdown strength of an oxide film created on a side face of such a wafer is 100%. Accordingly, almost every test point on the oxide layer has a required breakdown strength of at least 8 MV/cm.

Other objects and features of the present invention will become apparent from the following detailed description considered in connection with the accompanying examples which disclose several embodiments of the present invention. It should be understood, however, that the examples are designed for the purpose of illustration only and not as a definition of the limits of the invention.

DETAILED DESCRIPTION OF PREFERRED EMBODIMENTS

The following examples demonstrate that, as a result of an increase in the axial temperature gradient effected in the growing single crystal by means of structural measures in the pulling system, silicon wafers which are without a stacking-fault ring and have a GOI of approximately 100% can be pulled at pulling speeds which are above 0.5 mm/min, hitherto regarded as the limit.

EXAMPLE 1

A silicon single crystal having the orientation <100> and a diameter of 4 inches was pulled in a standard pulling system by the Czochralski pulling method. In order to be able to determine the maximum pulling speed $v_{crit}$, the pulling speed was reduced linearly from 1.8 to 0.6 mm/min during the pulling of the crystal. As a structural feature for increasing the axial temperature gradient in the region of the solid/liquid phase boundary, a pot-like cover of molybdenum sheet served as a shield which thermally screened the growing single crystal. A batten-shaped test piece was axially cut out of the cylindrical crystal after it had cooled. The test piece was first subjected to a heat treatment (3 h at 780° C. and 16 h at 1000° C.) and then to a standard etchant ("Seiter etchant") for revealing crystal defects. The correlation of the pulling speed and the observed crystal defects revealed that a stacking-fault ring had still not occurred at a maximum speed of 0.6 mm/min.

EXAMPLE 2

To pull a single crystal in accordance with Example 1, a shield which thermally screened the single crystal and had active water cooling was used to increase the axial temperature gradient. The evaluation of this experiment revealed that the maximum pulling speed at which the stacking-fault ring had still not appeared had risen to 1.0 mm/min.

EXAMPLE 3

A further single crystal was pulled in the pulling system configured in accordance with Example 2, the previously determined maximum pulling speed of 1.0 mm/min being kept constant during the pulling of the crystal. The cooled single crystal was then processed further to produce polished silicon wafers. A standard GOI test performed on said wafers revealed that an oxide film created on a wafer surface had the required dielectric breakdown strength at almost all the test points.

EXAMPLE 4

After pulling a single crystal having a diameter of 6 inches under the conditions described in Example 2, the subsequent determination of the maximum pulling speed yielded a value of 0.8 mm/min.

EXAMPLE 5

As a result of additionally blackening the side surface, directed towards the single crystal, of the shield thermally screening the single crystal and of the reduction in the reflection of thermal radiation associated therewith, it was possible to raise the maximum pulling speed for a silicon crystal pulled otherwise in accordance with Example 4 to 1.0 mm/min.

While only several embodiments of the present invention have been shown and described, it is to be understood that many changes and modifications may be made thereunto without departing from the spirit and scope of the invention as defined in the appended claims.

What is claimed is:

1. A method for pulling a single crystal in the vertical direction with respect to a silicon melt held in a crucible, which method comprises pulling the single crystal having a solid/liquid phase boundary at a speed which is not higher than a maximum pulling speed ($v$crit) which is calculated according to the empirical formula $$v\text{crit} = f * G$$

where f is a proportionality factor having the value $13*10^{-4}$ cm$^2$/K*min and G is an axial temperature gradient in the region of the solid/liquid phase boundary of the growing single crystal in the unit [K/cm] and the maximum pulling speed $v_{crit}$ is obtained in the unit [cm/min].

2. The method as claimed in claim 1, comprising increasing the maximum pulling speed by increasing the temperature gradient in the growing single crystal by a shield which thermally screens the single crystal.

3. The method as claimed in claim 2, comprising actively cooling the shield which thermally screens the single crystal.

4. The method as claimed in claim 2, wherein the shield which thermally screens the single crystal is blackened on its side surface directed towards the single crystal.

5. The method as claimed in claim 2, wherein the lower edge of the shield which thermally screens the single crystal approaches the solid/liquid phase boundary of the growing single crystal as closely as possible.

6. The method as claimed in claim 2, wherein the thermal history of the single crystal is varied by changing the thermal screening and cooling action of the shield and the maximum pulling speed.

* * * * *